United States Patent
Zhao et al.

(10) Patent No.: US 9,437,812 B2
(45) Date of Patent: Sep. 6, 2016

(54) TMR DEVICE WITH NOVEL FREE LAYER STRUCTURE

(71) Applicant: Headway Technologies, Inc., Milpitas, CA (US)

(72) Inventors: Tong Zhao, Fremont, CA (US); Hui-Chuan Wang, Pleasanton, CA (US); Yu-Chen Zhou, San Jose, CA (US); Min Li, Dublin, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/712,943

(22) Filed: May 15, 2015

(65) Prior Publication Data

US 2015/0249210 A1    Sep. 3, 2015

Related U.S. Application Data

(62) Division of application No. 12/284,409, filed on Sep. 22, 2008, now Pat. No. 9,040,178.

(51) Int. Cl.

| | |
|---|---|
| *H01L 43/12* | (2006.01) |
| *B82Y 10/00* | (2011.01) |
| *B82Y 25/00* | (2011.01) |
| *G01R 33/09* | (2006.01) |
| *G11B 5/39* | (2006.01) |
| *H01L 43/10* | (2006.01) |

(52) U.S. Cl.
CPC ............... *H01L 43/12* (2013.01); *B82Y 10/00* (2013.01); *B82Y 25/00* (2013.01); *G01R 33/098* (2013.01); *G11B 5/3909* (2013.01); *G11B 5/3929* (2013.01); *H01L 43/10* (2013.01); *G11B 2005/3996* (2013.01); *Y10T 428/1114* (2015.01); *Y10T 428/1121* (2015.01); *Y10T 428/1143* (2015.01)

(58) Field of Classification Search
None
See application file for complete search history.

(56) References Cited

U.S. PATENT DOCUMENTS

| | | | |
|---|---|---|---|
| 6,841,395 B2 | 1/2005 | Linn et al. | |
| 6,888,704 B1 * | 5/2005 | Diao | G11B 5/3929 360/324.1 |

(Continued)

OTHER PUBLICATIONS

"Giant room-temperature magnetoresistance in single-crystal Fe/MgO/Fe magnetic tunnel junctions," by Shinji Yuasa et al., Nature Publishing Group, nature materials, vol. 3, Dec. 2004, pp. 868-871, www.nature.com/naturematerials.

"Giant tunnelling magnetoresistance at room temperature with MgO (100) tunnel barriers," by Stuart S. P. Parkkin et al., Nature Publishing Group, mature materials, vol. 3, pp. 862-867, Dec. 2004, www.nature.com/naturematerials.

(Continued)

*Primary Examiner* — Kevin Bernatz
(74) *Attorney, Agent, or Firm* — Saile Ackerman LLC; Stephen B. Ackerman

(57) ABSTRACT

A method of fabricating a TMR sensor that includes a free layer having at least one B-containing (BC) layer made of CoFeB, CoFeBM, CoB, CoBM, or CoBLM, and a plurality of non-B containing (NBC) layers made of CoFe, CoFeM, or CoFeLM is disclosed where L and M are one of Ni, Ta, Ti, W, Zr, Hf, Tb, or Nb. In every embodiment, a NBC layer contacts the tunnel barrier and NBC layers each with a thickness from 2 to 8 Angstroms are formed in alternating fashion with one or more BC layers each 10 to 80 Angstroms thick. Total free layer thickness is <100 Angstroms. The TMR sensor may be annealed with a one step or two step process. The free layer configuration described herein enables a significant noise reduction (SNR enhancement) while realizing a high TMR ratio, low magnetostriction, low RA, and low Hc values.

7 Claims, 2 Drawing Sheets

(56) References Cited

U.S. PATENT DOCUMENTS

| | | | |
|---|---|---|---|
| 6,982,932 B2 | 1/2006 | Sakakima et al. | |
| 7,310,210 B2 | 12/2007 | Miyauchi et al. | |
| 7,746,602 B2 | 6/2010 | Gill | |
| 7,780,820 B2 | 8/2010 | Zhao et al. | |
| 8,472,151 B2 | 6/2013 | Wang et al. | |
| 9,021,685 B2 | 5/2015 | Zhao et al. | |
| 2002/0048128 A1 | 4/2002 | Kamiguchi et al. | |
| 2003/0123198 A1 | 7/2003 | Sugawara et al. | |
| 2005/0052793 A1* | 3/2005 | Hong | B82Y 10/00 360/324.12 |
| 2007/0047159 A1* | 3/2007 | Zhao | B82Y 25/00 360/324.12 |
| 2007/0111332 A1 | 5/2007 | Zhao et al. | |
| 2007/0253116 A1 | 11/2007 | Takahashi | |
| 2009/0122450 A1* | 5/2009 | Wang | B82Y 10/00 360/324.2 |
| 2009/0168271 A1* | 7/2009 | Mauri | B82Y 10/00 360/324.12 |

OTHER PUBLICATIONS

"Giant tunneling magnetoresistance up to 410% at room temperature in fully epitaxial Co/MgO/Co magnetic tunnel junctions with bbc Co(001) electrodes," Applied Physics Letters 89, 042505 (2006), pp. 1-3, Jul. 25, 2006.

230% room-temperature magnetoresistance in CoFeB/MgO/CoFeB magnetic tunnel junctions, by David D. Djayaprawira et al., Applied Physics Letters 86, 092502 (2005), pp. 1-3, Feb. 23, 2005.

"Giant tunneling magnetoresistance effect in low-resistance CoFeB/MgO (001)/CoFeB magnetic tunnel junctions for read-head applications," by Koji Tsunekawa et al., Applied Physics Letters 87, 072503 (2005), pp. 1-3, Aug. 8, 2005.

"Ultralow resistance-area product of 0.4 $\Omega(\mu m)\Lambda2$ and high magnetoresistance above 50% in CoFeB/MgO/CoFeB magnetic tunnel junctions," by Yoshinori Nagamine et al., Applied Physics Letters 89, 162507 (2006), pp. 1-3, Oct. 17, 2006.

\* cited by examiner

TMR DEVICE WITH NOVEL FREE LAYER STRUCTURE

This is a Divisional application of U.S. patent application Ser. No. 12/284,409, filed on Sep. 22, 2008, now U.S. Pat. No. 9,040,178 B2, which is herein incorporated by reference in its entirety; and assigned to a common assignee.

RELATED PATENT APPLICATIONS

This application is related to the following: U.S. Pat. No. 7,780,820; U.S. Pat. No. 8,472,151; and U.S. Pat. No. 9,021,685; all assigned to a common assignee and herein incorporated by reference in their entirety.

FIELD OF THE INVENTION

The invention relates to a high performance tunneling magnetoresistive (TMR) sensor in a read head and a method for making the same, and in particular, to a composite free layer comprised of multiple CoFe or CoFe alloy layers alternating with one or more CoB, CoB alloy, CoFeB, or CoFeB alloy layers to reduce head noise while achieving acceptable RA (resistance×area) and dR/R values.

BACKGROUND OF THE INVENTION

A TMR sensor otherwise known as a magnetic tunneling junction (MTJ) is a key component (memory element) in magnetic devices such as Magnetic Random Access Memory (MRAM) and a magnetic read head. A TMR sensor typically has a stack of layers with a configuration in which two ferromagnetic layers are separated by a thin non-magnetic insulator layer. The sensor stack in a so-called bottom spin valve configuration is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure that indicates the direction of the sense current.

A giant magnetoresistive (GMR) head is another type of memory device. In this design, the insulator layer between the pinned layer and free layer in the TMR stack is replaced by a non-magnetic conductive layer such as copper.

In the TMR stack, the pinned layer may have a synthetic anti-ferromagnetic (SyAF) configuration in which an outer pinned layer is magnetically coupled through a coupling layer to an inner pinned layer that contacts the tunnel barrier. The outer pinned layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 micron×0.1 micron at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) and low coercivity (Hc), a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$.

A MgO based MTJ is a very promising candidate for high frequency recording applications because its tunneling magnetoresistive (TMR) ratio is significantly higher than for AlOx or TiOx based MTJs. S. Yuasa et al. in "Giant room-temperature magnetoresistance in single crystal Fe/MgO/Fe magnetic tunnel junctions", Nature Materials 3, 868-871 (2004) and S. Parkin et al. in "Giant tunneling magnetoresistance at room temperature with MgO (100) tunnel barriers", Nature Materials 3, 862-867 (2004) demonstrated that a MR ratio of ~200% can be achieved at room temperature in epitaxial Fe(001)/MgO(001)/Fe(001) and in polycrystalline FeCo(001)/MgO(001)/(Fe$_{70}$CO$_3$O$_{80}$B$_{20}$ MTJs. Yuasa et al. reported an MR ratio as high as 410% at RT in "Giant tunneling magnetoresistance up to 410% at room temperature in fully epitaxial Co/MgO/Co magnetic tunnel junctions with bcc Co(001) electrodes", Applied Physics Letters, 89, 042505 (2006). Meanwhile, D. Djayaprawira et. al showed that MTJs of CoFeB/MgO(001)/CoFeB structure made by conventional sputtering can also have a very high MR ratio of 230% with advantages of better flexibility and uniformity in "230% room temperature magnetoresistance in CoFeB/MgO/CoFeB magnetic tunnel junctions", Physics Letters 86, 092502 (2005).

For a low RA application, the MR ratio of CoFeB/Mg/MgO/CoFeB MTJs can reach 138% at RA=2.4 ohm/μm$^2$ according to K. Tsunekawa et al. in "Giant tunneling magnetoresistance effect in low resistance CoFeB/MgO(001)/CoFeB magnetic tunnel junctions for read head applications", Applied Physics Letters 87, 072503 (2005). In this case, a DC-sputtered Mg layer was inserted between the CoFeB pinned layer and an RF-sputtered MgO layer, an idea initially proposed by T. Linn et al. in U.S. Pat. No. 6,841,395 to prevent oxidation of the bottom electrode (CoFe) in a CoFe/MgO(reactive sputtering)/NiFe structure. Also, a Ta getter presputtering prior to RF sputtering a MgO layer can achieve 55% TMR with 0.4 ohm/μm$^2$ as reported by Y. Nagamine et al. in "Ultralow resistance-area product of 0.4 ohm/μm$^2$ and high magnetoresistance above 50% in CoFeB/MgO/CoFeB magnetic junctions", Applied Physics Letters, 89, 162507 (2006).

An alternative method of forming low RA in a MTJ with a MgO tunnel barrier is to DC sputter deposit a first Mg layer, perform a natural oxidation (NOX) process, and then DC sputter deposit a second Mg layer on the resulting MgO layer as disclosed in related U.S. Pat. No. 7,780,820. Benefits include better process control and improved MRR (read) uniformity.

In order to achieve a smaller He but still maintain a high TMR ratio, the industry tends to use CoFeB as the free layer in a TMR sensor based on a MgO tunnel barrier. Insertion of a thin CoFe layer between a MgO barrier and CoFeB free layer may be used for realizing a high MR ratio at a low annealing temperature below 300° C. However, there are two major concerns associated with a CoFeB free layer. One is a high positive magnetostriction ($\lambda$) and a second issue is a CoFeB free layer tends to cause excessive noise and lower the signal to noise ratio (SNR) which is undesirable. Thus, an improved free layer in a TMR sensor is needed that reduces noise and magnetostriction while providing a high TMR ratio, low RA value, and low coercivity.

U.S. Pat. No. 7,310,210 mentions a CoFeB/Cu/CoFeB free layer where the larger spin polarization on the boundaries between the CoFeB layers and Cu layer promote spin dependent scattering and enhance the magnetoresistive effect.

In U.S. Pat. No. 6,982,932, a free layer is disclosed which is a laminate of CoFeB and CoNbZr. The laminate may be formed on a CoFe layer to provide an interface between the free layer and an isolating layer.

U.S. Patent Application Publication No. 2007/0253116 describes a magnetic layer that contains CoFe, CoFeB, a CoFe alloy, or a combination of these films.

U.S. Patent Application Publication No. 2005/0052793 teaches a free layer with a trilayer configuration wherein each of the first, second, and third layers is selected from a group including Ni, Co, Fe, B, CoFe, CoFeB, NiFe, and alloys thereof.

U.S. Patent Application Publication No. 2003/0123198 discloses a free layer made of a CoFe film, NiFe film, or a CoFeB film or a lamination layer film of these films to realize a larger MR ratio and a soft magnetic characteristic.

SUMMARY OF THE INVENTION

One objective of the present invention is to provide a TMR sensor with a free layer composition that reduces noise compared with CoFeB or CoFe/CoFeB while maintaining an acceptable TMR value and achieving a magnetostriction between $-5 \times 10^{-6}$ and $5 \times 10^{-6}$, a low RA value below 3 ohm-$\mu m^2$, and a low coercivity in the range of 4 to 7 Oe.

A further objective of the present invention is to provide a method of forming a TMR sensor that satisfies the first objective and is cost effective.

According to one embodiment of the present invention, these objectives are achieved by forming a TMR sensor on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The tunnel barrier layer is preferably MgO formed by a process involving a natural oxidation of a DC sputter deposited Mg layer. Optional tunnel barrier materials are MgZnO, ZnO, $Al_2O_3$, TiOx, AlTiO, HfOx, ZrOx, or combinations thereof or with MgO. In one embodiment, the free layer is a composite comprised of a stack represented by $(CoFe/CoFeB)_n$, $(CoFeM/CoFeB)_n$, $(CoFe/CoFeBM)_n$, $(CoFeM/CoFeBM)_n$, $(CoFeLM/CoFeB)_n$, or $(CoFeLM/CoFeBM)_n$ where M and L are one of Ni, Ta, Ti, W, Zr, Hf, Tb, and Nb, M is unequal to L, and $n \geq 2$. There is a second embodiment where the free layer is a composite comprised of a stack represented by $(CoFe/CoB)_n$, $(CoFeM/CoB)_n$, $(CoFeLM/CoB)_n$, $(CoFe/CoBM)_n$, $(CoFeM/CoBM)_n$, $(CoFeLM/CoBM)_n$, $(CoFe/CoBLM)_n$, $(CoFeM/CoBLM)_n$, or $(CoFeLM/CoBLM)_n$ where L and M are one of Ni, Ta, Ti, W, Zr, Hf, Tb, or Nb, M is unequal to L, and $n \geq 2$. The CoB layer has a composition represented by $Co_SB_T$ where T is from 5 to 30 atomic % and S+T=100 atomic %. In the first two embodiments, each of the plurality of CoFeB, CoFeBM, CoB, CoBM, or CoBLM layers has a thickness greater than each of the plurality of CoFe, CoFeM, or CoFeLM layers.

In a third embodiment, the free layer stack is represented by a $(CoFe/CoFeB)_n/CoFe$, $(CoFeM/CoFeB)_n/CoFeM$, $(CoFe/CoFeBM)_n/CoFe$, $(CoFeM/CoFeBM)_n/CoFeM$, $(CoFeLM/CoFeB)_n/CoFeLM$, or $(CoFeLM/CoFeBM)_n/CoFeLM$ configuration where n is $\geq 1$, and L and M are one of Ni, Ta, Ti, W, Zr, Hf, Tb, or Nb, and L is unequal to M. The one or more CoFeB or CoFeBM layers preferably have a greater thickness than each of the CoFe, CoFeM, or CoFeLM layers.

There is a fourth embodiment wherein the free layer has a configuration represented by $(CoFe/CoB)_n/CoFe$, $(CoFe/CoBM)_n/CoFe$, $(CoFe/CoBLM)_n/CoFe$, $(CoFeM/CoB)_n/CoFeM$, $(CoFeM/CoBM)_n/CoFeM$, $(CoFeM/CoBLM)_n/CoFeM$, $(CoFeLM/CoB)_n/CoFeLM$, $(CoFeLM/CoBM)_n/CoFeLM$, or $(CoFeLM/CoBLM)_n/CoFeLM$ where $n \geq 1$, L and M are one of Ni, Ta, Ti, W, Zr, Hf, Tb, and Nb, and L is unequal to M. The B content in the CoB, CoBM, or CoBLM alloy is from about 5 to 30 atomic %. The one or more CoB, CoBM, or CoBLM layers preferably have a greater thickness than each of the CoFe, CoFeM, or CoFeLM layers.

Typically, a TMR stack of layers is laid down in a sputtering system. All of the layers may be deposited in the same sputter chamber. Preferably, the MgO tunnel barrier is formed by depositing a first Mg layer on the pinned layer followed by a natural oxidation process on the first Mg layer to form a MgO layer and then depositing a second Mg layer on the MgO layer. The oxidation step is performed in an oxidation chamber within the sputtering system. The TMR stack is patterned by a conventional method prior to forming a top shield on the cap layer.

DETAILED DESCRIPTION OF THE INVENTION

The present invention is a high performance TMR sensor featuring a composite free layer comprised of CoFeB, CoB, or alloys thereof in which excessive noise normally associated with these boron containing magnetic materials is reduced by forming a free layer configuration that includes a plurality of CoFe or CoFe alloy layers. While the exemplary embodiment depicts a TMR sensor in a read head, the present invention may be employed in other devices based on a tunneling magnetoresistive element such as CIP-GMR or CPP-GMR sensors. Although a bottom spin valve structure is described for a TMR sensor, the present invention also encompasses a top spin valve or multilayer spin valve configuration as appreciated by those skilled in the art. Drawings are provided by way of example and are not intended to limit the scope of the invention. For example, various elements are not necessarily drawn to scale and their relative sizes may differ compared with those in an actual device.

Previously, the inventors have practiced a method in related U.S. Pat. No. 9,021,685 whereby a two step annealing procedure is used to restore some of the magnetic softness lost when a CoFeB layer is included in a free layer. The procedure involves applying a magnetic field with a first temperature and for a first length of time and then applying a magnetic field with a second temperature greater than the first temperature but for less than the first length of time. However, noise reduction is not achieved by this procedure.

It should be understood that in a CoFeB based free layer, a certain B content is needed to achieve the required magnetic softness. However, a large amount of non-magnetic B (typically 20 atomic %) that increases softness also tends to introduce extra noise and cause a degradation in the signal-to-noise ratio (SNR) in the read head. Higher B content also leads to high magnetostriction ($\lambda$) in the device which is a concern. Related U.S. Pat. No. 8,472,151 discloses how a CoFeB composition may be adjusted to reduce $\lambda$ and how CoB with a slightly negative $\lambda$ value may be used to replace CoFeB with a large positive $\lambda$ value. However, there is still a significant noise associated with a CoB layer because of its boron content. Therefore, we were motivated to further modify the free layer to improve performance and have discovered a composite free layer structure containing boron that reduces noise (improves SNR) while realizing a high dR/R, low $\lambda$ value, low RA, and low coercivity.

Figure 1:
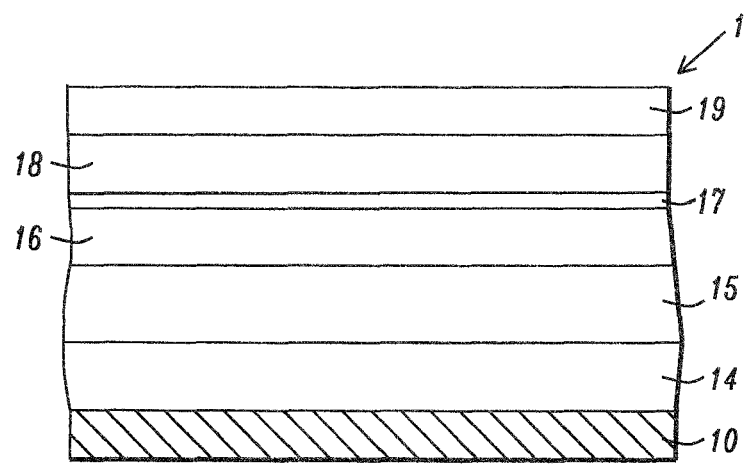
FIG. 1 is a cross-sectional view showing a TMR stack of layers according to one embodiment of the present invention.

Referring to FIG. 1, a portion of a partially formed TMR sensor 1 of the present invention is shown from the plane of an air bearing surface (ABS). There is a substrate 10 that in one embodiment is a bottom lead otherwise known as a bottom shield (Si) which may be a NiFe layer about 2 microns thick that is formed by a conventional method on a substructure (not shown). It should be understood that the substructure may be comprised of a wafer made of AlTiC, for example.

A TMR stack is formed on the substrate 10 and in the exemplary embodiment has a bottom spin valve configuration wherein a seed layer 14, AFM layer 15, pinned layer 16, tunnel barrier layer 17, free layer 18, and capping layer 19 are sequentially formed on the substrate. The seed layer 14 is preferably a Ta/Ru composite but Ta, Ta/NiCr, Ta/Cu, Ta/Cr or other seed layer configurations may be employed, instead. The seed layer 14 serves to promote a smooth and uniform grain structure in overlying layers. Above the seed layer 14 is an AFM layer 15 used to pin the magnetization direction of the overlying pinned layer 16, and in particular, the outer portion or AP2 layer (not shown). The AFM layer 15 has a thickness from 40 to 300 Angstroms and is preferably comprised of IrMn. However, one of PtMn, NiMn, OsMn, RuMn, RhMn, PdMn, RuRhMn, or MnPtPd may be employed as the AFM layer.

The pinned layer 16 preferably has a synthetic antiparallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer contacts the AFM layer 15 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 16 along the easy axis direction of the TMR sensor to be patterned in a later step. Exchange coupling between the AP2 layer and the AP1 layer is facilitated by a coupling layer that is preferably comprised of Ru with a thickness from 3 to 9 Angstroms. The AP1 layer is also referred to as the inner pinned layer and may be a single layer or a composite layer. In one aspect, the AP1 layer is amorphous in order to provide a more uniform surface on which to form the tunnel barrier layer 17. The AP1 layer may be comprised of CoFeB, CoFe, or a composite thereof, and has an upper surface that contacts the tunnel barrier layer 17.

In the exemplary embodiment that features a bottom spin valve configuration, the tunnel barrier layer 17 is preferably comprised of MgO because a MgO tunnel barrier is known to provide a higher TMR ratio than a TMR stack made with an $Al_2O_3$ or TiOx tunnel barrier. However, the present invention anticipates that the TMR stack may have a tunnel barrier made of MgZnO, ZnO, $Al_2O_3$, TiOx, AlTiO, HfOx, ZrOx, or combinations of two or more of the aforementioned materials including MgO.

In an embodiment where the tunnel barrier layer 17 is made of MgO, a preferred process is to DC sputter deposit a first Mg layer having a thickness between 4 and 14 Angstroms on the pinned layer 16, and then oxidize the Mg layer with a natural oxidation (NOX) process before depositing a second Mg layer with a thickness of 2 to 8 Angstroms on the oxidized first Mg layer as described in related U.S. Pat. No. 8,472,151. In one aspect, the tunnel barrier is considered as having a MgO/Mg configuration. The second Mg layer serves to protect the subsequently deposited free layer from oxidation. It is believed that excessive oxygen accumulates at the top surface of the MgO layer as a result of the NOX process and this oxygen can oxidize a free layer that is formed directly on the MgO portion of the tunnel barrier layer. Note that the RA and MR ratio for the TMR sensor may be adjusted by varying the thickness of the two Mg layers in tunnel barrier layer 17 and by varying the natural oxidation time and pressure. Longer oxidation time and/or higher oxygen pressure will form a thicker MgO layer and increase the RA value.

All layers in the TMR stack may be deposited in a DC sputtering chamber of a sputtering system such as an Anelva C-7100 sputter deposition system that includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The NOX process may be performed in an oxidation chamber within the sputter deposition system by applying an oxygen pressure of $10^{-6}$ Torr to 1 Torr for about 15 to 300 seconds. In the exemplary embodiment, no heating or cooling is applied to the oxidation chamber during the NOX process. Oxygen pressure between $1 \times 10^{-6}$ and 1 Torr is preferred for an oxidation time mentioned above in order to achieve a RA in the range of 0.5 to 5 ohm-um$^2$. A mixture of $O_2$ with other inert gases such as Ar, Kr, or Xe may also be used for better control of the oxidation process. We have found that the final RA uniformity (1σ) of 0.6 um circular devices is more than 10% when a MgO tunnel barrier layer is rf-sputtered and less than 3% when the MgO tunnel barrier is formed by DC sputtering a Mg layer followed by a NOX process.

Figure 2:
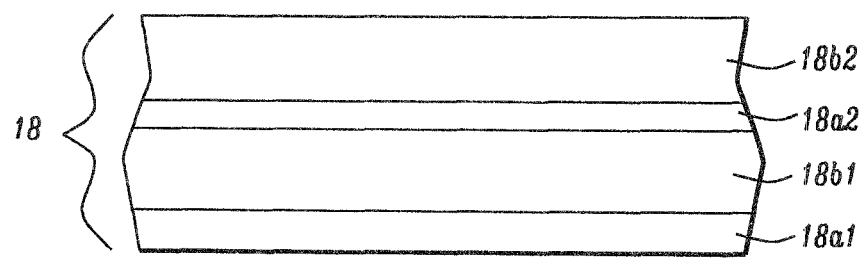
FIG. 2 is an enlarged drawing of the free layer in FIG. 1 that illustrates the various layers within the composite structure according to one embodiment of the present invention.

Returning to FIG. 1, an important feature of the present invention is the free layer 18 formed on the tunnel barrier layer 17. In a first embodiment illustrated in FIG. 2, the free layer 18 has a laminated structure represented by (CoFe/CoFeB)$_n$, (CoFeM/CoFeB)$_n$, (CoFeLM/CoFeB)$_n$, (CoFe/CoFeBM)$_n$, (CoFeM/CoFeBM)$_n$, or (CoFeLM/CoFeBM)$_n$ where n≥2, L and M are one of Ni, Ta, Ti, W, Zr, Hf, Tb, and Nb, and M is unequal to L. The CoFeB layer has a $[Co_{(100-x)}Fe_x]_{100-y}B_y$ composition where x is from 0 to 100 atomic % and y is between 10 and 40 atomic %. In a CoFeBM alloy, the B content is preferably between 5 and 40 atomic %. In one example, M=Ni to give a CoNiFeB layer. The CoNiFeB layer may be formed by co-sputtering CoB and CoNiFe. CoB is preferably used in the co-sputtering process as a means of adjusting λ.

In the exemplary embodiment where n=2, CoFe, CoFeM, or CoFeLM layers 18a1, 18a2 alternate with boron containing layers 18b1, 18b2. When M, or L and M are selected from the group of Ta, Ti, W, Zr, Hf, Tb and Nb, the content of M or L+M in the CoFeM alloy and CoFeLM alloy, respectively, is preferably less than 10 atomic %.

A first stack of layers is shown as 18a1/18b1 and a second stack formed on the first stack is designated 18a2/18b2 where layer 18a2 contacts layer 18b1 and layer 18b2 is the uppermost layer. Note that a CoFe layer 18a1 contacts the underlying tunnel barrier layer 17 and thereby separates the CoFeBM or CoFeB layer 18b1 from the tunnel barrier. The present invention also anticipates a free layer structure with a plurality of "n" stacks of 18a/18b layers wherein n>2 and the two layers in the upper stack would be designated 18an/18bn (not shown) and the 18a and 18b layers are formed in alternating fashion beginning with an 18a1 layer contacting the tunnel barrier layer 17.

Each 18a layer (18a1 to 18an) is comprised of CoFe, CoFeM, or CoFeLM and has a thickness between 2 and 8 Angstroms and each 18b layer (18b1 to 18bn) is comprised of CoFeB or CoFeBM and has a thickness from 10 to 80 Angstroms. Total thickness of free layer 18 is preferably less than 100 Angstroms. Note that the thickness of each of the CoFe, CoFeM, or CoFeLM layers is less than the thickness of each of the CoFeB or CoFeBM layers to maximize the MR ratio. In other words, MR ratio decreases as the CoFe, CoFeM, or CoFeLM content increases in free layer 18. According to the present invention, it is important that an 18a layer contacts the tunnel barrier layer 17. Otherwise, a TMR structure in which a CoFeB or CoFeBM layer 18b contacts a tunnel barrier would lead to a higher noise level and lower MR ratio. It is also important to cap or laminate 18b layers with 18a layers for the purpose of noise reduction.

In a second embodiment, the 18b1, 18b2 layers in an example where n=2 are comprised of CoB and the CoB layer is preferably a low magnetostriction material $Co_SB_T$ where T is from 5 to 30 atomic % and S+T=100 atomic %. Alternatively, one or more CoB layers may be replaced by an alloy such as CoBM or CoBLM. Moreover, one or more of the 18a layers may be comprised of CoFe, a CoFeM alloy, or a CoFeLM alloy as in the first embodiment. When M, or L and M are selected from the group of Ta, Ti, W, Zr, Hf, Tb and Nb, the content of M or L+M in the CoFeM alloy and CoFeLM alloy, respectively, is preferably less than 10 atomic %.

Thus, free layer configurations of the second embodiment are represented by (CoFe/CoB)$_n$, (CoFe/CoBM)$_n$, (CoFe/CoBLM)$_n$, (CoFeM/CoB)$_n$, (CoFeM/CoBM)$_n$, (CoFeM/CoBLM)$_n$, (CoFeLM/CoB)$_n$, (CoFeLM/CoBM)$_n$, and (CoFeLM/CoBLM)$_n$ where n≥2, L and M are one of Ni, Ta, Ti, W, Zr, Hf, Tb, and Nb, and L is unequal to M. The B content in the CoBM and CoBLM alloy is from about 5 to 30 atomic %.

Each of the 18a layers (CoFe, CoFeM, or CoFeLM) has a thickness from 2 to 8 Angstroms and each of the 18b layers (CoB, CoBM, or CoBLM) has a thickness from 10 to 80 Angstroms. Total thickness of the free layer 18 is preferably less than 100 Angstroms.

Figure 3:
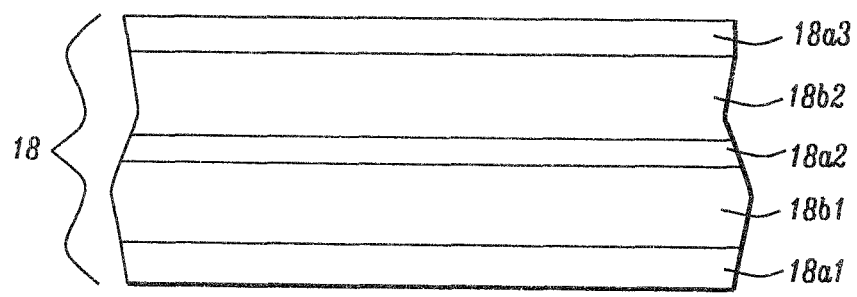
FIG. 3 is an enlargement of the free layer in FIG. 1 that shows the layers within the composite structure according to a second embodiment of the present invention.

Referring to FIG. 3, a third embodiment of the present invention is depicted in which free layer 18 has a configuration represented by (CoFe/CoFeB)$_n$/CoFe, (CoFeM/CoFeB)$_n$/CoFeM, (CoFe/CoFeBM)$_n$/CoFe, (CoFeM/CoFeBM)$_n$/CoFeM, (CoFeLM/CoFeB)$_n$/CoFeLM, or (CoFeLM/CoFeBM)$_n$/CoFeLM where n is ≥1, and L and M are one of Ni, Ta, Ti, W, Zr, Hf, Tb, or Nb, and L is unequal to M. As in the first embodiment shown in FIG. 2, the CoFe, CoFeM, or CoFeLM layers 18a alternate with the boron containing layers 18b, and a layer 18a contacts the tunnel barrier layer 17. However, in this embodiment the top layer is a non-boron containing layer. When n=1, a layer 18a1 contacts the tunnel barrier layer, a layer 18b1 is formed on layer 18a1, and layer 18a2 is the uppermost layer in the free layer 18 stack. When n=2, the uppermost layer is layer 18a3 rather than a boron containing layer. As a result, non-boron containing layers (i.e. 18a1, 18a2, 18a3) alternate with boron containing layers (18b1, 18b2). When n>2, the top CoFe, CoFeM or CoFeLM layer may be designated as 18an and the 18a layers from bottom to top are in succession 18a1, 18a2, ... 18an and alternate with the 18b layers that are formed from bottom to top in succession 18b1, 18b2, ... 18b(n−1). It is also important in this embodiment that the tunnel barrier layer 17 is contacted by an 18a layer and not an 18b layer. Uppermost layer 18an contacts the capping layer (not shown).

In a fourth embodiment, the free layer 18 has a configuration represented by (CoFe/CoB)$_n$/CoFe, (CoFe/CoBM)$_n$/CoFe, (CoFe/CoBLM)$_n$/CoFe, (CoFeM/CoB)$_n$/CoFeM, (CoFeM/CoBM)$_n$/CoFeM, (CoFeM/CoBLM)$_n$/CoFeM, (CoFeLM/CoB)$_n$/CoFeLM, (CoFeLM/CoBM)$_n$/CoFeLM, or (CoFeLM/CoBLM)$_n$/CoFeLM where n≥1, L and M are one of Ni, Ta, Ti, W, Zr, Hf, Tb, and Nb, and L is unequal to M. The B content in the CoB, CoBM, or CoBLM alloy is from about 5 to 30 atomic %.

In an example where n=1, a layer 18a1 contacts the tunnel barrier layer 17, a layer 18b1 is formed on layer 18a1, and a layer 18a2 is disposed on layer 18b1. When n>1, the top CoFe, CoFeM or CoFeLM layer may be designated as 18an and the 18a layers are formed from bottom to top in succession 18a1, ... 18an. Likewise, the boron containing 18b layers are formed from bottom to top in succession 18b1, ... 18b(n−1).

After the free layer 18 is formed, a capping layer 19 is deposited on the free layer. Capping layer 19 may be comprised of Ru, Ta, or combinations thereof such as Ru/Ta/Ru. A Ru upper layer is typically preferred since Ru is resistant to oxidation, provides a good electrical connection to an overlying top lead (top shield) formed in a subsequent step, and serves as a CMP stop during a subsequent planarization process.

Once the TMR stack is complete, the partially formed read head 1 may be annealed in a vacuum oven within the range of 240° C. to 340° C. with an applied magnetic field of at least 2000 Oe, and preferably 8000 Oe for about 2 to 10 hours to set the pinned layer and free layer magnetization directions. It should be understood that under certain conditions, depending upon the time and temperature involved in the anneal process, the tunnel barrier layer 17 may become a uniform MgO tunnel barrier layer as unreacted oxygen diffuses into the adjacent Mg layer. In another embodiment, a two step anneal process as described previously may be employed.

Figure 4:
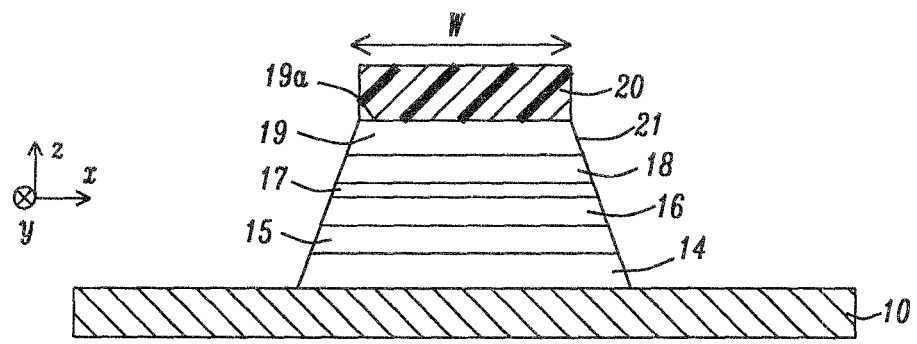
FIG. 4 is a cross-sectional view showing a TMR stack of layers that has been patterned to form a MTJ element during an intermediate step of fabricating the TMR sensor according to one embodiment of the present invention.

Referring to FIG. 4, the TMR stack is patterned by following a conventional process sequence. For example, a photoresist layer 20 may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process stops on the bottom shield 10 or between the bottom shield and a barrier layer (not shown) to give a TMR sensor with a top surface 19a and sidewalls 21.

Figure 5:
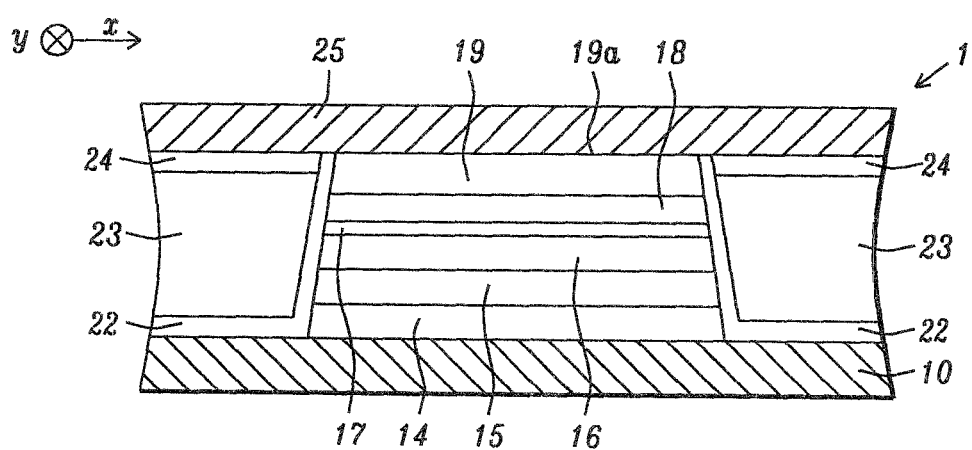
FIG. 5 is a cross-sectional view of a TMR read head having a MTJ element interposed between a top shield and bottom shield and formed according to an embodiment of the present invention.

Referring to FIG. 5, an insulating layer 22 may be deposited along the sidewalls 21 of the TMR sensor. The photoresist layer 20 is then removed by a lift off process. A top lead otherwise known as a top shield 25 is then deposited on the insulating layer 22 and top surface 19a of the TMR sensor. Similar to the bottom shield 10, the top shield 25 may also be a NiFe layer about 2 microns thick. The TMR read head 1 may be further comprised of a second gap layer (not shown) disposed on the top shield 25.

Comparative Example

An experiment was conducted to demonstrate the improved performance achieved by implementing a free layer in a TMR sensor according to the present invention. A TMR stack of layers, hereafter referred to as Sample A and shown in Table 1, was fabricated as a reference and is comprised of a CoFe/CoB free layer wherein the lower $Co_{70}Fe_{30}$ layer is 5 Angstroms thick and the upper $Co_{80}B_{20}$ layer is 48 Angstroms thick. This free layer was disclosed in related U.S. Pat. No. 8,472,151. All samples in the experiment have a seed/AFM/AP2/Ru/AP1/MgO/free layer/Ru configuration where AP2 and AP1 layers are comprised of CoFe, the seed layer is Ta/Ru, and the AFM layer is IrMn. The MgO tunnel barrier was formed by depositing a 7 Angstrom thick lower Mg layer that was subjected to a NOX process before a 4 Angstrom thick upper Mg layer was deposited. Sample B comprises a free layer represented by $(CoFe/CoB)_2$ according to the second embodiment of the present invention. Sample C (n=1) and Sample D (n=2) have a $(CoFe/CoB)_n/CoFe$ free layer according to the fourth embodiment of the present invention.

The thicknesses in Angstroms of the other TMR layers are given in parentheses: Ta(20)/Ru(20) seed layer; IrMn (70) AFM layer; CoFe(25)Ru(7.5)CoFe(20) pinned layer; and Ru(50) capping layer. The TMR stack was formed on a NiFe shield and was annealed with a two step process comprised of a first anneal at 250° C. for 3 hours and a second anneal at 280° C. for 1.5 hours with an applied field of 8000 Oe to achieve high dR/R while maintaining good magnetic softness.

TABLE 1

Magnetic properties of MgO MTJs with $Fe_{70}Co_{30}/Co_{80}B_{20}$ based free layers

| Sample | Free Layer Composition | Bs | Hc (Oe) | Lambda | RA | dR/R |
|---|---|---|---|---|---|---|
| A | FeCo5/CoB48 | 0.60 | 4.6 | $1.20 \times 10^{-6}$ | 1.8 | 60% |
| B | FeCo5/CoB24/ FeCo5/CoB24 | 0.68 | 5.9 | $8.2 \times 10^{-7}$ | 1.7 | 60% |
| C | FeCo5/CoB50/ FeCo5 | 0.63 | 5.3 | $2.0 \times 10^{-6}$ | 1.8 | 58% |
| D | FeCo5/CoB22/ FeCo5/CoB22/FeCo5 | 0.72 | 6.8 | $1.3 \times 10^{-6}$ | 1.8 | 58% |

Sample B was formed by inserting a thin CoFe layer in the CoB layer of Sample A and resulted in a slight increase in Hc of about 1 Oe. There was little or no effect on Hc, λ, RA, and dR/R. For Sample C, a thin CoFe layer was added above the CoB layer in Sample A. Sample D represents insertion of a thin CoFe layer in the CoB layer in Sample A and addition of a thin CoFe layer as the top layer in the free layer stack. A CoFe cap caused a slight decrease of about 2% in dR/R while λ, Hc, and RA are all comparable to the Sample A reference. All three Samples B-D exhibited reduced noise with no signal loss (not shown) compared with Sample A which is a significant improvement over prior art technology.

Although not bound by theory, we believe that the noise reduction effect may be attributed to a change in free layer microstructure, modification of boron distribution in the CoB layer such that there is a lower concentration near the interface with CoFe layers, magnetic coupling between CoFe layers, or a combination of one or more of the aforementioned effects.

The free layers disclosed in the embodiments found herein may be fabricated without additional cost since no new sputtering targets or sputter chambers are required. Furthermore, a low temperature anneal process may be employed which is compatible with the processes for making GMR sensors. Therefore, there is no change in process flow and related processes compared with current manufacturing schemes.

While this invention has been particularly shown and described with reference to, the preferred embodiment thereof, it will be understood by those skilled in the art that various changes in form and details may be made without departing from the spirit and scope of this invention.

We claim:
1. A method of forming a sensor element in a magnetic device, comprising:
   (a) sequentially forming a stack of layers comprised of a seed layer, anti-ferromagnetic (AFM) layer, and a SyAP pinned layer having an AP2/coupling/AP1 configuration on a substrate wherein the AP2 layer contacts said AFM layer;
   (b) forming a tunnel barrier having a first surface that contacts the AP1 layer and a second surface opposite the first surface;
   (c) forming a composite free layer on the tunnel barrier, the composite free layer is comprised of:
      (1) at least one CoFeB, CoFeBTb, CoB, CoBTb, or CoBTbL layer having a first thickness and where L is one of Ni, Ta, Ti, W, Zr, Hf, or Nb, and said at least one CoFeB, CoFeBTb, CoB, CoBTb, or CoBTbL layer is formed in an alternating configuration with the plurality of CoFeTb, or CoFeTbL layers; and

(2) the plurality of CoFeTb, or CoFeTbL layers each having a second thickness less than the first thickness, and one of the CoFeTb, or CoFeTbL layers contacts said second surface of the tunnel barrier; and (d) forming a capping layer on the composite free layer.

2. The method of claim 1 wherein the first thickness of each of the at least one CoFeB, CoFeBTb, CoB, CoBTb, and CoBTbL layers is about 10 Angstroms to 80 Angstroms.

3. The method of claim 1 wherein the second thickness is from about 2 to 8 Angstroms.

4. The method of claim 1 wherein the tunnel barrier is comprised of MgO, MgZnO, ZnO, $Al_2O_3$, TiOx, AlTiO, HfOx, ZrOx, or a combination of two or more of the aforementioned materials.

5. The method of claim 1 wherein the tunnel barrier is MgO and is formed by a process of DC sputter depositing a first Mg layer, performing a natural oxidation process to yield a MgO layer, and then DC sputter depositing a second Mg layer on said MgO layer.

6. The method of claim 1 further comprised of annealing the sensor element in a vacuum oven within a temperature range of about 240° C. to 340° C. with an applied magnetic field of 2000 Oe to 8000 Oe for about 2 to 10 hours.

7. The method of claim 1 further comprised of a two step annealing process wherein a first anneal is performed at a temperature of about 250° C. for 3 hours, and a second anneal is performed at a temperature of about 280° C. for 1.5 hours with an applied field of 8000 Oe.

* * * * *